US009238867B2

(12) United States Patent
Granneman et al.

(10) Patent No.: US 9,238,867 B2
(45) Date of Patent: *Jan. 19, 2016

(54) APPARATUS AND METHOD FOR HIGH-THROUGHPUT ATOMIC LAYER DEPOSITION

(75) Inventors: Ernst H. A. Granneman, Hilversum (NL); Herbert Terhorst, Amersfoort (NL)

(73) Assignee: ASM INTERNATIONAL N.V., Almere (NL)

( * ) Notice: Subject to any disclaimer, the term of this patent is extended or adjusted under 35 U.S.C. 154(b) by 434 days.

This patent is subject to a terminal disclaimer.

(21) Appl. No.: 12/993,361

(22) PCT Filed: May 20, 2009

(86) PCT No.: PCT/NL2009/050270
§ 371 (c)(1),
(2), (4) Date: Jan. 6, 2011

(87) PCT Pub. No.: WO2009/142487
PCT Pub. Date: Nov. 26, 2009

(65) Prior Publication Data
US 2011/0268879 A1    Nov. 3, 2011

Related U.S. Application Data

(63) Continuation of application No. 12/123,745, filed on May 20, 2008, now abandoned.

(51) Int. Cl.
*C30B 25/14* (2006.01)
*C30B 29/20* (2006.01)
(Continued)

(52) U.S. Cl.
CPC ............ *C23C 16/54* (2013.01); *C23C 16/45551* (2013.01); *C30B 25/14* (2013.01); *C30B 29/20* (2013.01); *C30B 35/005* (2013.01); *H01L 21/67784* (2013.01)

(58) Field of Classification Search
CPC ............ H01L 21/677; H01L 21/67703; H01L 21/67784–21/67793; C23C 16/45525–16/45555; C23C 14/56; C23C 14/568; C23C 16/54; C23C 16/45519; C30B 25/14–25/165; C30B 29/20; C30B 35/005
USPC .......... 118/718, 719, 728; 156/345.2, 345.22, 156/345.23, 345.51
See application file for complete search history.

(56) References Cited

U.S. PATENT DOCUMENTS 3,603,646 A * 9/1971 Leoff ............................. 406/89
4,058,430 A   11/1977 Suntola et al.
(Continued)

FOREIGN PATENT DOCUMENTS

WO   WO 2006/005214       1/2006
WO   WO 2006005214 A1 *  1/2006
(Continued)

OTHER PUBLICATIONS

Levy, David H., "Stable ZnO thin film transistors by fast open air atomic layer deposition," American Institute of Physics, Applied Physics Letters 92, 192101 (2008).

*Primary Examiner* — Gordon R Baldwin
*Assistant Examiner* — Benjamin Kendall
(74) *Attorney, Agent, or Firm* — Preti Flaherty Beliveau & Pachios LLP

(57) ABSTRACT

An atomic layer deposition apparatus for depositing a film in a continuous fashion is described. The apparatus includes a downwardly sloping process tunnel, extending in a transport direction and bounded by at least two tunnel walls. Both walls are provided with a plurality of gas injection channels, whereby the gas injection channels in at least one of the walls, viewed in the transport direction, are connected successively to a first precursor gas source, a purge gas source, a second precursor gas source and a purge gas source respectively, so as to create a series of tunnel segments that—in use—comprise successive zones containing a first precursor gas, a purge gas, a second precursor gas and a purge gas, respectively. The downward slope of the process tunnel enables gravity to drive the floatingly supported substrates through the successive segments, causing the atomic layer deposition of a film onto the substrates.

16 Claims, 8 Drawing Sheets

(51) Int. Cl.
*C30B 35/00* (2006.01)
*C23C 16/455* (2006.01)
*C23C 16/54* (2006.01)
*H01L 21/677* (2006.01)

(56) References Cited

U.S. PATENT DOCUMENTS

| | | | | |
|---|---|---|---|---|
| 4,413,022 | A | | 11/1983 | Suntola et al. |
| 4,495,024 | A | * | 1/1985 | Bok ................................ 216/57 |
| 4,587,002 | A | * | 5/1986 | Bok ........................ 204/298.25 |
| 4,622,918 | A | | 11/1986 | Bok |
| 4,874,273 | A | * | 10/1989 | Tokisue et al. .................. 406/88 |
| 6,183,565 | B1 | * | 2/2001 | Granneman et al. .......... 118/725 |
| 6,315,501 | B1 | * | 11/2001 | Yagai et al. .................... 406/198 |
| 6,719,499 | B1 | * | 4/2004 | Kuznetsov et al. ............. 406/90 |
| 6,746,237 | B2 | | 6/2004 | Storm et al. |
| 6,824,619 | B1 | | 11/2004 | Kuznetsov et al. |
| 6,872,421 | B2 | | 3/2005 | Hwang et al. |
| 7,104,476 | B2 | | 9/2006 | Kim |
| 7,456,429 | B2 | * | 11/2008 | Levy ................................ 257/66 |
| 2004/0067641 | A1 | * | 4/2004 | Yudovsky ..................... 438/680 |
| 2005/0217137 | A1 | | 10/2005 | Smith et al. |
| 2007/0015374 | A1 | | 1/2007 | Granneman |
| 2007/0160454 | A1 | * | 7/2007 | Iida ................. 414/806 |
| 2007/0281089 | A1 | * | 12/2007 | Heller et al. ................ 427/255.5 |
| 2009/0078204 | A1 | * | 3/2009 | Kerr et al. ..................... 118/728 |

FOREIGN PATENT DOCUMENTS

| | | |
|---|---|---|
| WO | WO 2007/126585 | 11/2007 |
| WO | WO 2008/085474 | 7/2008 |
| WO | WO 2009/042044 | 4/2009 |
| WO | WO 2009/042147 | 4/2009 |

* cited by examiner

APPARATUS AND METHOD FOR HIGH-THROUGHPUT ATOMIC LAYER DEPOSITION

FIELD OF THE INVENTION

The invention relates to the field of thin film deposition, and, more particularly, to an apparatus and method for atomic layer deposition of films.

BACKGROUND

Atomic layer deposition (ALD) is a thin film deposition method that allows for the deposition of films having thicknesses on the order of nanometers in a precisely controlled way. Typically, ALD uses two or more gaseous precursors that are alternately and repeatedly applied to a substrate. A series of sequential steps in which a surface of the substrate is exposed to all precursors is called a deposition cycle. Each deposition cycle grows a single monolayer of film, or a fraction of a monolayer. This is due to the fact that, in ALD, film growth depends on chemisorption, a process whereby a precursor molecule adheres to a substrate's surface through the formation of a chemical bond (without further thermal decomposition of the precursor molecule taking place). Chemisorption stops naturally when all substrate surface sites available for chemical bonding with a precursor have been covered. Consequently, ALD is a self-limiting layer-by-layer deposition method that offers highly conformal coating and excellent thickness control. These characteristics make it a method of interest to various industries, among which in particular the semiconductor, and more specifically, the solar cell industry.

In the solar cell industry, ALD may be used to deposit aluminum oxide ($Al_2O_3$) films for the passivation of advanced mono-Si solar cells. To this end typical film thicknesses of 5-15 nm are required, which can be achieved using traditional single or multi-wafer ALD systems. Currently, the throughput of the most efficient multi-wafer ALD systems at said film thickness is about 60 wafers per hour. The amount of surface area to be treated in order to obtain—for example—a solar cell panel for use on a rooftop, is considerable however. And with the demand for solar cell panels on the rise, there is an increasing need for ALD apparatus featuring a higher throughput. Of course, the solar cell industry is exemplary only, and merely one of many industries in which the continual pressure for ALD equipment having an increased throughput is felt.

Such higher throughput is preferably achieved using apparatus that are relatively simple from a constructional point of view. This is because, typically, the simpler an apparatus is, the more economically it may be built, the more reliable it is and the less servicing it requires. It is therefore an object of the present invention to provide a device and a method for atomic layer deposition offering an improved throughput capacity at a minimum level of constructional complexity.

SUMMARY OF THE INVENTION

According to one aspect of the invention, an atomic layer deposition apparatus is provided. The apparatus includes a process tunnel that extends in a transport direction and that is bounded by at least a first, lower wall and a second, upper wall. Said walls are mutually parallel and spaced apart so as to allow a substantially flat substrate, oriented parallel to the walls, to be accommodated there between. The apparatus further includes a plurality of gas injection channels. These gas injection channels are provided in both the first wall and the second wall of the process tunnel and are disposed in a spaced apart manner along the transport direction. The gas injection channels in the first, lower wall are configured to provide a first, lower gas bearing, while the gas injection channels in the second, upper wall are configured to provide a second, upper gas bearing. The gas bearings are configured to floatingly support and accommodate substrates. Viewed in the transport direction, gas injection channels in at least one of the first wall and the second wall are connected successively to a first precursor gas source, a purge gas source, a second precursor gas source and a purge gas source, so as to create a tunnel segment that—in use—comprises successive zones including a first precursor gas, a purge gas, a second precursor gas and a purge gas, respectively. Two or more of such tunnel segments are disposed in succession in the transport direction. Viewed in the transport direction, at least a portion of the process tunnel has a downward slope ($\alpha$), so as to enable gravity driven transport of substrates through said at least one process tunnel portion.

According to an aspect of the invention, a method is provided for growing a film on a substrate. The method comprises providing a first, lower gas bearing and a second, upper gas bearing, said gas bearings being configured to floatingly support and accommodate the substrate between them. The gas bearings extend downwards in a longitudinal transport direction. The method also comprises providing a substrate, and supporting and accommodating it between the gas bearings. The method further comprises enabling gravity to convey the substrate along the gas bearings in the transport direction, while subjecting a surface of the substrate to an atomic layer deposition treatment.

According to an aspect of the method according to the invention, at least one of the first and second gas bearings, viewed in the transport direction, is divided into two or more functional segments, each segment comprising at least four laterally extending zones that successively include a first precursor gas, a purge gas, a second precursor gas and a purge gas, respectively, and an atomic layer is deposited onto at least one surface of the substrate as it is conveyed through all at least four zones of a single functional segment of said gas bearing.

These and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
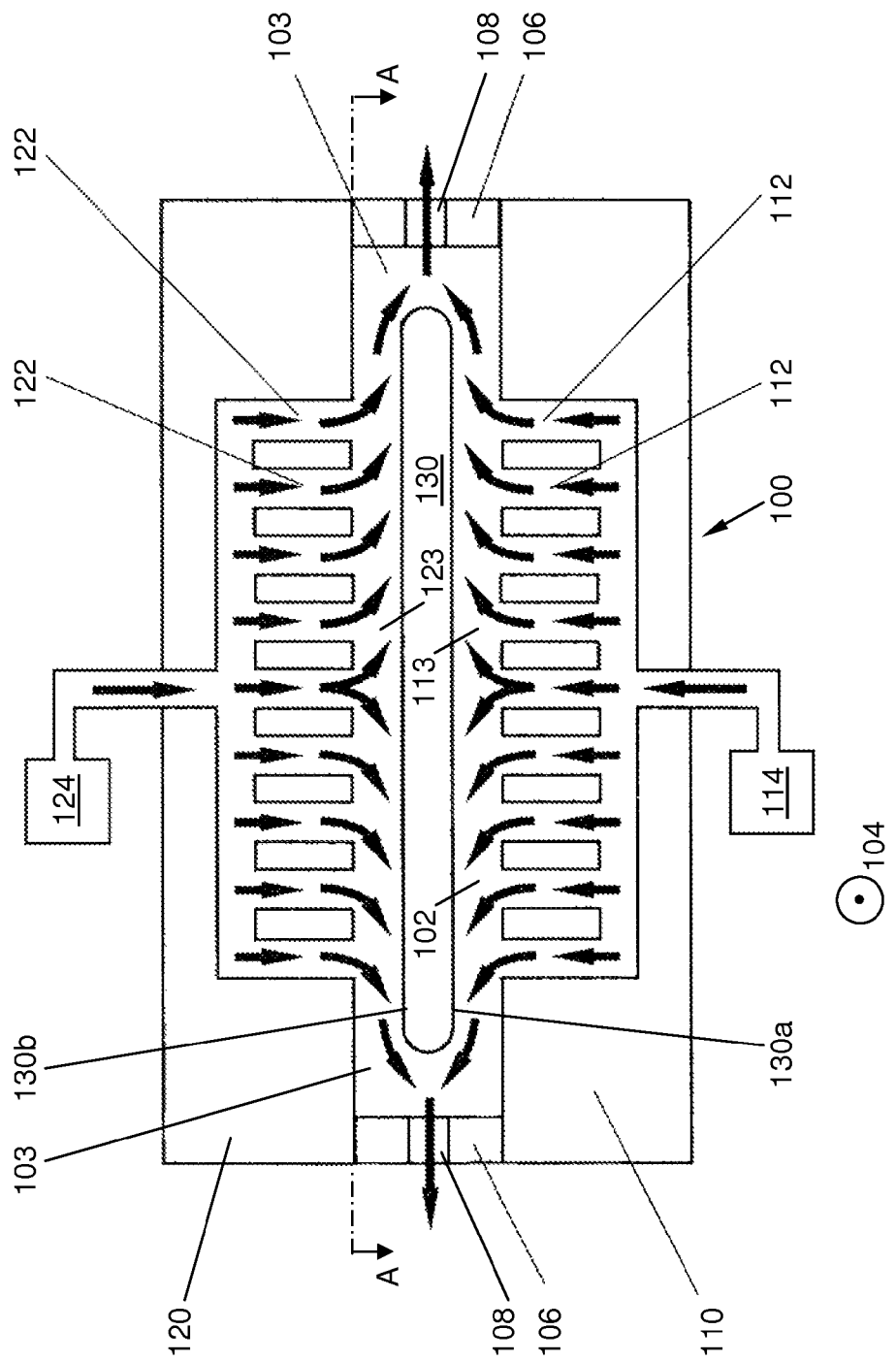
FIG. 1 is a diagrammatic lateral cross-sectional view of an exemplary disclosed atomic layer deposition apparatus having two parallel tunnel walls between which a substrate is accommodated.

The disclosed atomic layer deposition apparatus includes a process tunnel through which a substrate, preferably as part of a train of substrates, may be conveyed in a linear manner. That is, the substrate may be inserted into the tunnel at an entrance thereof to be conveyed to an exit. The tunnel is bounded by at least two substantially parallel tunnel walls. These tunnel walls are located close to both the substrate and each other, so as to provide an elongate processing space with a relatively small volume per unit of length. In its longitudinal direction, the process tunnel is divided into a series of segments. In use each segment comprises a number—typically four—of laterally extending gas zones. Successive zones within a segment comprise a first precursor gas, a purge gas, a second precursor gas, and a purge gas respectively. As the substrate moves through the tunnel, its surface (e.g. its lower surface, its upper surface, or both) is strip-wise subjected to contact with the different gases. Provided the arrangement of the zones and the respective gases are chosen properly, traversal of one tunnel segment may be equivalent to subjecting the substrate to one atomic layer deposition cycle. Since the tunnel may comprise as many segments as desired, a film of arbitrary thickness may be grown on a substrate during its crossing through the tunnel. The linear nature of the process tunnel enables a continuous stream of substrates to be processed, thus delivering an atomic layer deposition apparatus with an appreciably improved throughput capacity.

To convey a substrate in the transport direction, the process tunnel is fitted with two gas bearings, located opposite each other and capable of receiving a substrate between them. A lower bearing supports the substrate from below, while an upper bearing covers substrate from above, thereby pressing it against the lower gas bearing so as to flatten it, and stabilize its position. The lower gas bearing may be provided for via the gas injection channels that are disposed in the lower, first tunnel wall, while the upper gas bearing may be provided for via the gas injection channels that are disposed in the upper, second tunnel wall. As the process tunnel slopes downwards, so do the tunnel walls and the gas bearings provided therein. Consequently, a substrate accommodated by the gas bearings will experience a gravitational force (component) that pulls it in the transport direction. This gravitational force causes the substrate to advance glidingly through the process tunnel. The presently disclosed apparatus thus features a substrate drive mechanism that is essentially passive in that substrates are gravity driven. Such a 'gravity drive' eliminates the need for a separate substrate conveyor whose parts are subject to soiling (due to their continuous traversal of the deposition environment maintained in the process tunnel), wear and inevitable periodic servicing, and as a result enables a simpler, more economical and more reliable ALD apparatus design.

From here on, reference is made to the appended drawings. In these drawings, identical reference numbers identify similar elements or acts. The sizes and relative positions of elements in the drawings are not necessarily drawn to scale. The shapes of various elements and angles may, for example, not be drawn to scale, and some of these elements may have been arbitrarily enlarged and positioned to improve drawing legibility. Further, the particular shapes of the elements as drawn are not intended to convey any information regarding the actual shape of the particular elements, and may have been selected solely for ease of recognition in the drawings.

FIG. 1 is a diagrammatic lateral cross-sectional illustration of an exemplary disclosed atomic layer deposition apparatus 100, suitable for depositing a film on a substrate 130. The apparatus 100 comprises a process tunnel space 102, which is bounded by a first, lower tunnel wall 110, a second, upper tunnel wall 120, and side walls 106 that connect the first and second tunnel walls. The tunnel walls 110, 120 are substantially parallel and spaced apart from each other to allow the substrate 130, e.g. a semiconductor wafer, to be accommodated there between. In FIG. 1, the tunnel walls 110, 120 extend longitudinally in a transport direction 104 that is perpendicular to the plane of the drawing. In reality the transport direction 104 and the tunnel walls 110, 120 slope downwards (cf. FIGS. 3 and 4), at least locally. In the lateral direction, perpendicular to the longitudinal transport direction 104, the tunnel walls 110, 120 may be oriented horizontally, as shown, or have an inclination relative to the horizontal.

Both tunnel walls 110, 120 are fitted with a plurality of gas injection channels 112 and 122, respectively. The outflow openings of the gas injection channels 112, 122 are distributed over the inside surfaces of the respective tunnel walls 110, 120 that are facing the substrate, both along the lateral and the longitudinal directions thereof. In FIG. 1, a lateral tunnel wall cross-section comprises nine gas injection channels 112, 122. It is contemplated, however, that a lateral tunnel wall cross-section may include a greater or lesser number of gas injection channels 112, 122.

The gas injection channels 112, 122 in the tunnel walls 110, 120 are connected to (a number of) gas sources 114 and 124, respectively. Gas injection channels in the same tunnel wall and at the same longitudinal position thereof (e.g. the gas injection channels 112 visible in FIG. 1), may generally be connected to gas sources of the same gas or gas mixture. Whether opposing gas channels that share the same longitudinal position of the process tunnel but are situated in opposite tunnel walls (e.g. the gas injections channels 112 and 122 visible in FIG. 1), are connected to gas sources of the same gas composition depends on the desired configuration of the apparatus 100. This aspect will be elaborated upon below with reference to FIGS. 3 and 4. For now and the remainder of this specification, it will be tacitly assumed that opposing gas injection channels 112, 122 at the same longitudinal position are configured to inject the same gas or gas mixture, unless stated otherwise.

In use, the gas injection channels 112, 122 may inject gases into the tunnel space 102 over the whole length of the tunnel. Once injected, the gases flow laterally between the tunnel walls 110, 120. When a substrate 130 is present, this means that the gases flow laterally across the lower and upper surfaces 130a, 130b of the substrate 130, towards the edges of the substrate and beyond. Lateral gas flows occur provided that the gases can escape at both lateral sides of the tunnel. To this end, the side walls 106 of the process tunnel may be provided with exhaust channels 108. An exhaust channel 108 is preferably held at or around atmospheric pressure, so as to render vacuum pumps superfluous. Alternatively, however, an exhaust channel 108 may be held at a pressure that deviates from atmospheric pressure, such as a lower or higher pressure. The sidewalls 106 restrict the outflow of gas. They stagnate the lateral gas flows and cause pressure buildup in the tunnel space regions 103 adjacent the side walls 106, which helps to stabilize the lateral position of the floating substrate 130.

It is understood that the gas injection channels 112 in the lower, first wall 110 generally provide for the lateral gas streams that occupy the lower half of the process tunnel space 102 (i.e. the lower gas bearing 113), whereas the gas injection channels 122 in the upper, second wall 120 generally provide for the lateral gas streams that occupy the upper half of the process tunnel space (i.e. the upper gas bearing 123). When a substrate 130 is present between both tunnel walls 110, 120, the lateral gas streams in the lower half of the process tunnel space 102 serve as the gas bearing that floatingly supports the substrate from below.

Figure 2:
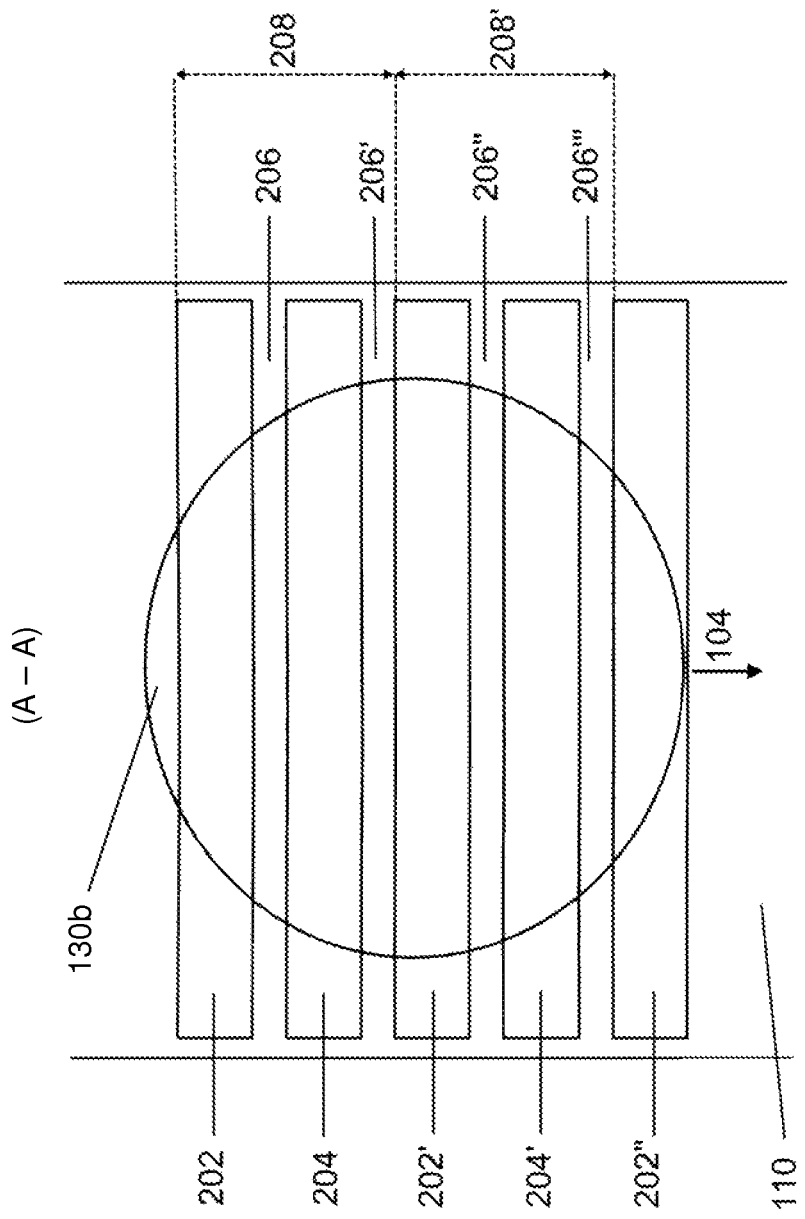
FIG. 2 is a diagrammatic cross-sectional plan view of a portion of the process tunnel shown in FIG. 1 as viewed along line A-A, illustrating the arrangement of segments and zones.

FIG. 2 schematically shows a cross-sectional plan view of a portion of the process tunnel shown in FIG. 1 as viewed along line A-A. Seen along transport direction 104, the lateral gas flows described above form successive, approximately tunnel wide zones of gas 202, 206, 204, 206', etc. Successive zones may be grouped into segments. The gas injection channels 112, 122 are preferably configured to provide a sequence of segments 208, 208', etc., wherein each segment comprises, in succession along the transport direction 104, a first precursor gas zone 202, a purge gas zone 206, a second precursor gas zone 204, and another purge gas zone 206'. The precursor gas zones 202, 204, etc. may comprise a pure precursor, or a gas mixture including both the respective precursor and an inert carrier gas, whereby the latter is added to facilitate transport of the precursor. The purge gas zones 206, 206', etc. may be arranged between any two zones 202, 204, etc. comprising mutually reactive precursors. They serve as gas phase diffusion barriers. Given the relatively narrow gaps between the surfaces 130a, 130b of the substrate 130 and the respective tunnel walls 110, 120, and the high lateral gas flow velocities (typically in the range of 1-2 m/s), these barriers are very effective in preventing the precursors from mixing. Consequently, hardly any deposition occurs on the tunnel walls, and the atomic layer deposition apparatus will have very low particle levels during operation.

In FIG. 2, substrate 130 moves through the tunnel in transport direction 104. Its lower and upper surfaces 130a, 130b are thereby strip-wise subjected to the gases present in each of the successive zones 202, 206, 204, 206', etc. When a strip of surface area has passed all zones of a single segment 208, 208', etc., it has undergone a full deposition cycle. Care must be taken to ensure that the configuration of the ALD apparatus 100 effects a suitable substrate transport velocity. The transport velocity of the substrate is preferably such that, when passing a specific precursor zone, a strip of substrate surface area is exposed to the precursor sufficiently long to ensure that it is fully saturated. A longer precursor zone generally allows for a higher transport velocity, and vice versa. Note, however, that the saturation time may depend on the nature of the precursor being used, and on the concentration of the precursor in the respective zone.

Figure 3:
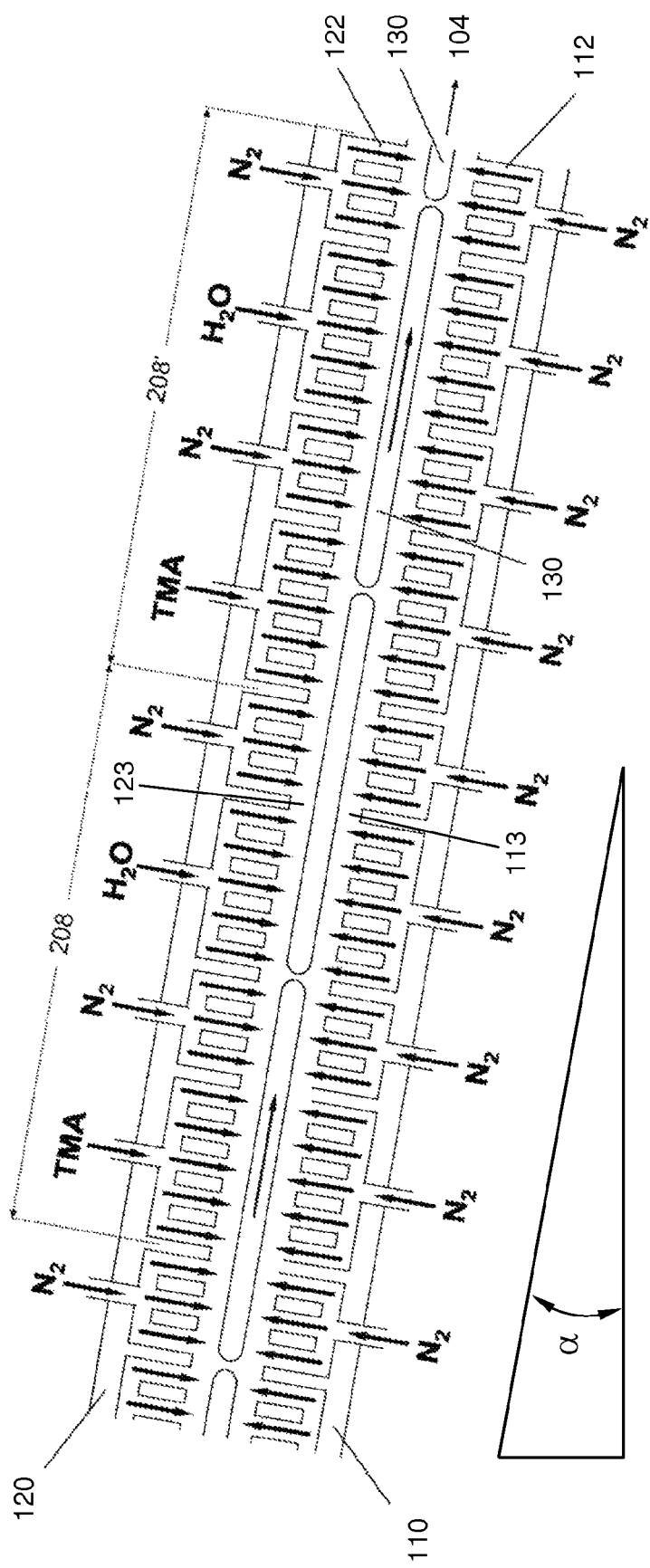
FIG. 3 is a diagrammatic longitudinal cross-sectional view of a portion of a process tunnel that is consistent with the embodiment shown in FIGS. 1 and 2, wherein the upper and lower tunnel walls are configured asymmetrically.
Figure 4:
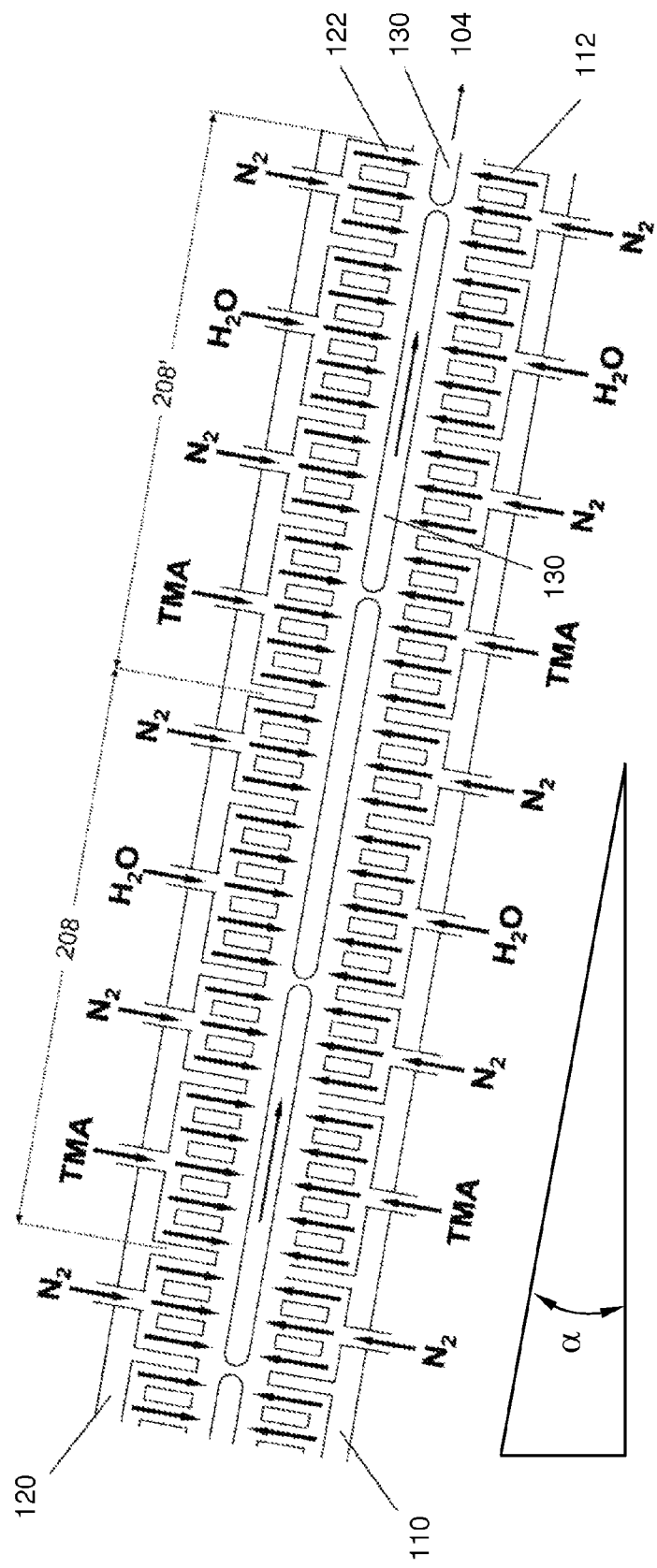
FIG. 4 is a diagrammatic longitudinal cross-sectional view of a portion of a process tunnel that is consistent with the embodiment shown in FIGS. 1 and 2, wherein the upper and lower tunnel walls are configured symmetrically.

FIGS. 3 and 4 each show a longitudinal cross-sectional view of an embodiment of an ALD apparatus that is consistent with the embodiment of the ALD apparatus shown in FIGS. 1 and 2.

FIG. 3 illustrates a longitudinal cross-sectional view of a portion of an asymmetrical process tunnel. The figure depicts two identical tunnel segments 208, 208', joined together in the longitudinal direction of the tunnel. Each segment 208, 208' comprises two series of gas injection channels, one series in the upper tunnel wall 120, and one series in the lower tunnel wall 110. Viewed in transport direction 104, the gas injection channels 122 of a segment 208, 208' in the upper wall 120 successively inject a first precursor gas (tri-methyl aluminum, TMA), a purge gas (nitrogen, $N_2$), a second precursor gas (water vapor, $H_2O$) and purge gas ($N_2$) respectively. The specific gases are, of course, exemplary. They may be chosen in accordance with the desired film structure. In fact, adjacent segments 208, 208' need not even be identical. Mixed films may for example be deposited fairly easily by adding or inserting segments that comprise a different combination of precursors. The gas injection channels 112 of a segment 208, 208' in the bottom tunnel wall 110 all inject nitrogen ($N_2$). Accordingly, viewed in the transport direction 104, the upper half of the process tunnel comprises a series of successive gas zones for performing atomic layer deposition, while the lower half is filled with an inert gas bearing 113. The inert gas bearing 113 prevents precursors that are present in the flows/gas bearing 123 above the substrates 130 to penetrate the space below it. As a result, no unintentional backside deposition occurs. Alternatively, the precursor gases may be provided at the lower surfaces 130a of the substrates 130 and an inert gas at the upper surfaces 130b of the substrates.

FIG. 4 illustrates an embodiment of the process tunnel wherein the lower, first tunnel wall 110 is configured symmetrically relative to upper, second tunnel wall 120. That is, opposite gas injection channels 112, 122 are connected to gas sources of a substantially identical gas composition. This configuration allows for simultaneous deposition on both surfaces 130a, 130b of a substrate 130, and thus for doubling the amount of treated substrate surface area.

Attention is now invited to the manner in which substrates 130 may be conveyed through the process tunnel. As discussed above, the atomic layer deposition apparatus according to the present invention relies, at least in part, on the force of gravity to transport substrates through the process tunnel. This 'gravity drive' requires the process tunnel to slope downwards as shown in FIGS. 3 and 4, at least locally. Not every slope, however, will result in a suitable substrate velocity. Moreover, the slope of the process tunnel is not the only factor that influences the substrate velocity. In order to provide a handle on the different parameters that affect the velocity of a substrate, a basic physical model of the situation is developed below. It will be appreciated by those skilled in the art that application of the model to practical embodiments of the ALD apparatus may require small adaptations to be made to compensate for non-ideal conditions or circumstances that deviate from those outlined.

Figure 5:
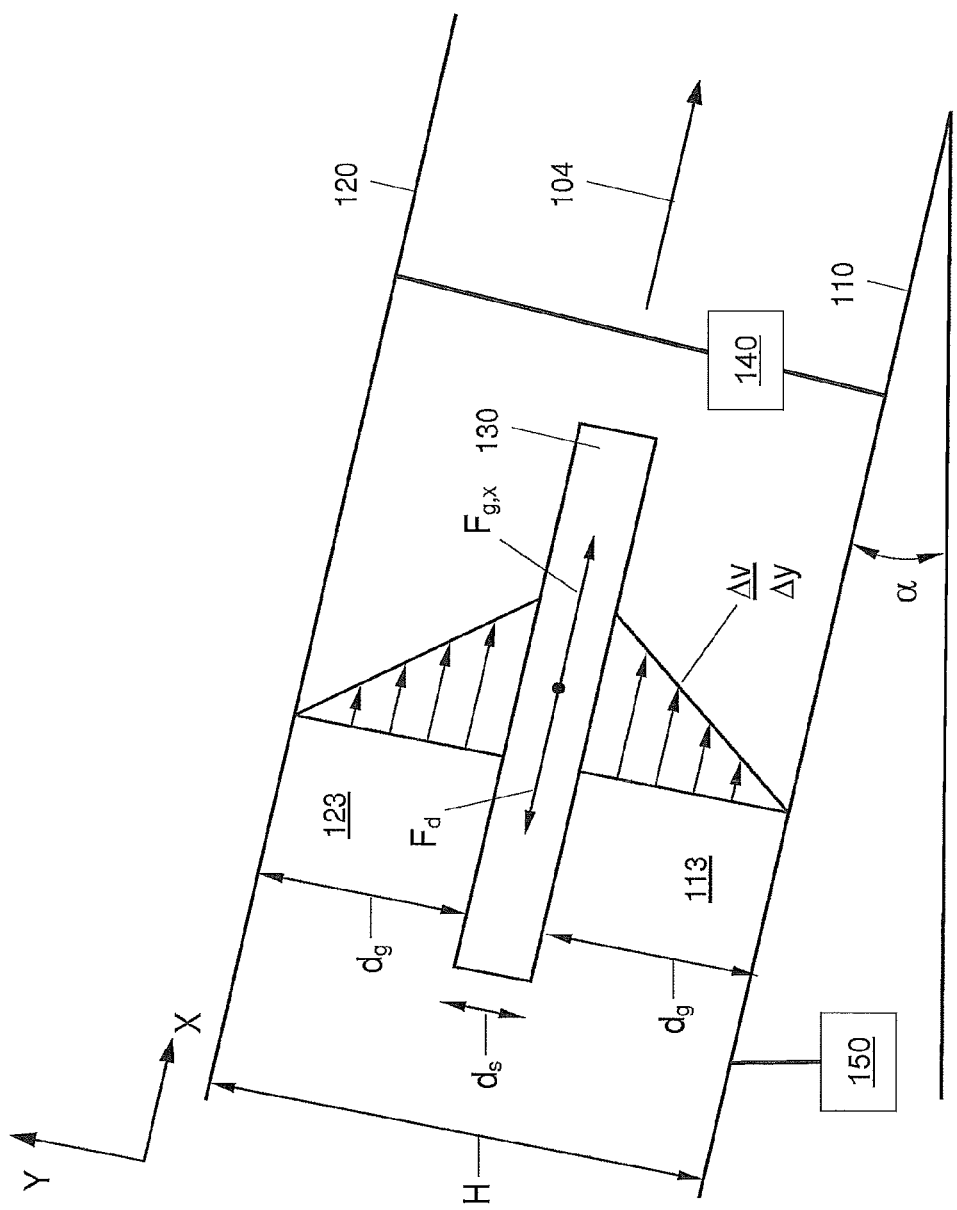
FIG. 5 is diagrammatic longitudinal cross-sectional view of a portion of a process tunnel, used to clarify a mathematical model put forward in the specification.

Referring to FIG. 5, which shows a schematic longitudinal cross-sectional side view of a portion of a process tunnel. In the figure, any gas injection channels have been omitted for reasons of drawing legibility. A substantially planar substrate 130 is located between the first, lower wall 110 and the second, upper wall 120 of the process tunnel. The first wall and the second wall 110, 120 are mutually parallel, whereas the substrate's lower and upper surfaces 130a, 130b are substantially parallel to the first wall 110 and the second wall 120, respectively. It is assumed that the situation is symmetrical, meaning that the substrate 130 is located precisely halfway between the tunnel walls 110, 120, and that the gas bearing contacting the lower surface 130a is identical to that contacting the upper surface 130b. The process tunnel, and hence the walls 110, 120 and the substrate 130, are inclined at an angle α with respect to the horizontal.

The net force on the substrate 130 in the direction of the process tunnel, denoted $F_n$, is assumed to be the resultant of two opposing forces: a viscous drag force acting on the bottom and top surfaces 130a, 130b of the substrate, denoted $F_d$, and a component of the force of gravity pulling the substrate through the process tunnel, denoted $F_{g,x}$, such that $$F_n = F_{g,x} - F_d \quad (1)$$

The viscous drag force $F_d$, which results from the interaction between the surfaces 130a, 130b of the substrate 130 and the gas bearings 113, 123, respectively, may be expressed as $$F_d = \eta \cdot 2A \cdot \frac{\Delta v}{\Delta y} = \eta \cdot 2A \cdot \frac{v_s}{d_g} \quad (2)$$

wherein $\Delta v/\Delta y$ denotes a velocity gradient in each of the gas bearings, present on both sides of the substrate (between the substrate's surfaces 130a, 130b and the respective tunnel walls 110, 120), η denotes a viscosity of the gas bearings, 2A denotes the combined surface area of the bottom and top surfaces of the substrate, $v_s$ denotes the velocity of the substrate in the transport direction of the process tunnel, and $d_g$ denotes the gap or distance between the bottom and top surfaces of the substrate and the first and second tunnel wall, respectively. In practice, the viscosity η may be approximated by a weighted average of the viscosities of the used purge and precursor gases, taking into account the relative lengths of the respective zones as weighting factors.

The gravitational force $F_{g,x}$ pulling the substrate 130 in the transport direction 104 may be expressed as $$F_{g,x} = m \cdot g \cdot \sin(\alpha) = \rho \cdot V \cdot g \cdot \sin(\alpha) = \rho \cdot d_s \cdot A \cdot g \cdot \sin(\alpha) \quad (3)$$

wherein m denotes the mass of the substrate, g denotes the gravitational acceleration, α denotes the angle of inclination of the process tunnel relative to the horizontal, ρ denotes the density of the substrate, V denotes the volume of the substrate, and $d_s$ denotes the thickness of the substrate.

Combining equations (1), (2) and (3), and setting the net force $F_n$ to zero, yields the following expression for the equilibrium velocity of the substrate $v_{s,eq}$ $$v_{s,eq} = \frac{\rho \cdot (d_s \cdot d_g) \cdot g \cdot \sin(\alpha)}{2\eta} \quad (4)$$

The equilibrium velocity as expressed by equation (4) is the velocity that a substrate 130 will ultimately assume after it has been inserted into the process tunnel. The equilibrium velocity $v_{s,eq}$ establishes itself as follows. Once the substrate 130 is in the process tunnel, it will experience a slope-related gravitational pull $F_{g,x}$ in the transport direction 104. The gas bearings 113, 123, in turn, induce an oppositely directed speed-dependent drag $F_d$ on the substrate 130: the greater the speed of the substrate (relative to the speed of the gas bearings in the transport direction), the greater the drag force, see equation (2). When the pull of gravity exceeds the drag, the substrate speeds up, and vice versa. A net force $F_n$ pulling on the substrate 130 thus causes the drag on the substrate to increase until the drag force $F_d$ equals the gravitational force $F_{g,x}$, from which point on the substrate's speed remains constant at $v_{s,eq}$. Likewise, a net force $F_n$ dragging on the substrate will cause the substrate 130 to slow down until the drag force $F_d$ equals the gravitational force $F_{g,x}$ and the substrate assumes a constant velocity $v_{s,eq}$.

The time it takes a substrate 130 to acquire the equilibrium speed $v_{s,eq}$ depends on its initial velocity, i.e. the velocity at which it is inserted into the process tunnel. The time constant τ of the first-order differential equation in $v_s$ $$F_n = m \cdot a_s = m \frac{dv_s}{dt} = \rho \cdot d_s \cdot A \cdot g \cdot \sin(\alpha) - \eta \cdot 2A \cdot \frac{v_s}{d_g} \quad (5)$$

which is a compilation of Newton's second law and equations (1), (2) and (3), is $$\tau = \frac{\rho \cdot (d_s \cdot d_g)}{2\eta} \quad (6)$$

Assuming a zero initial velocity, it will take the substrate approximately 5τ to acquire (over 99% of) its equilibrium velocity $v_s$. In this time period, an inserted substrate will travel a distance $x_{eq}$ of $$x_{eq} = \int_{t=0}^{t=5\tau} v_s \, dt = \\ \int_{t=0}^{t=5\tau} v_{s,eq}(1 - e^{-\frac{t}{\tau}}) \, dt = \left[v_{s,eq}\left(t + \tau \cdot e^{-\frac{t}{\tau}}\right)\right]_0^{5\tau} \approx 4 \cdot \tau \cdot v_{s,eq} \quad (7)$$

An important conclusion that may be drawn from equation (4) is that the equilibrium velocity $v_{s,eq}$ of a substrate 130 is dependent not only on the angle of inclination α of the process tunnel, but also on the product of the substrate thickness $d_s$ and the gap width $d_g$. The angle of inclination α, and the spacing between the lower and upper tunnel walls (i.e. the height of the process tunnel) H are design parameters that can be accurately chosen. In the real world, there may be significant variations in thickness around a target thickness among substrates. Such thickness variations may result in variations in the product $d_s d_g$ and, hence, in variations in the equilibrium velocity $v_{s,eq}$, which is undesirable as it may result in collisions between substrates. Given that $$H = d_s + 2d_g \quad (8)$$

it follows that $$d_s \cdot d_g = \frac{H \cdot d_s - d_s^2}{2} \quad (9)$$

from which it may be inferred that, at a given value of H, the product of substrate thickness $d_s$ and gap width $d_g$ has a maximum at $$H = 2 d_s \quad (10)$$

Thus, everything else being equal, a maximum equilibrium substrate velocity $v_{s,eq}$ may be obtained by choosing a height H such that it equals about twice the specified substrate thickness $d_s$ which implies that the gap width $d_g$ equals approximately half the substrate thickness $d_s$. The advantage of this choice is that relatively small variations of the substrate thickness $d_s$ and corresponding variations in the gap width $d_g$ around their target values, have only a marginal impact on the value of their product as a larger substrate thickness is (practically completely) compensated for by a reduced gap width, and vice versa. In other words, the variations in forward gravitational force and in the drag force as a result of variations in substrate thickness are substantially equal and compensate each other. Configurations wherein H falls within the range $1.4\, d_s \le H \le 5.0\, d_s$ may be considered to obey equation (10) to sufficient approximation for most practical purposes. More preferably H falls within the range $1.8\, d_s \le H \le 2.2\, d_s$.

Equation (10) may be implemented both statically and dynamically in an atomic layer deposition apparatus 100. In a static implementation, the embodiment of the atomic layer deposition apparatus 100 features a process tunnel with a fixed tunnel height H that is chosen in relation to one typical substrate thickness $d_s$ of substrates to be processed. In a dynamic implementation, the spacing H between the first tunnel wall 110 and the second tunnel wall 120 is adaptable upon changes of the typical substrate thickness $d_s$. This allows the performance of the atomic layer deposition apparatus 100 to be optimized for batches of substrates 130 having mutually varying thicknesses. A dynamic implementation may therefore include a spacing adjuster or spacing adaptation means 140, e.g. in the form of a distributed, possibly motor driven high precision jack mechanism, for changing the spacing H between the first wall 110 and the second wall 120 over at least a portion of the process tunnel.

In an alternative embodiment it was found that a gap width $d_g$ of about 150 μm results in gas bearing characteristics that are sufficiently "stiff", which means that the gas bearings 113, 123 keep the substrates in a stable position, spaced from the lower and upper walls of the tunnel while allowing movement in a direction parallel to the lower and upper walls. For lower values of $d_g$, the design becomes very critical and for higher values of $d_g$ the gas bearing becomes rather soft. For practical purposes $d_g$ may preferably have a value between 100 μm and 1 mm. For the height H it means that H may preferably be in a range between ($d_s$+100 μm) and ($d_s$+2 mm), and more preferably that H has a value in a range between ($d_s$+200 μm) and ($d_s$ ($d_s$+400 μm) even if this means that equation (10) is not met, or H is not in the range $1.4\, d_s \le H \le 5.0\, d_s$. Typical substrate thicknesses lie in the range of 50 μm to 1000 μm.

As regards the angle of inclination α, it is noted that the slope of the process tunnel is preferably determined in relation to at least the minimum time periods that a substrate 130 must be exposed to the gases in each of the respective reactive gas zones 202, 204. There is no need for the slope of the process tunnel to be constant along its entire length. In a mixed ALD apparatus, for example, wherein different tunnel segments 208 comprise different gases having mutually different viscosities, a process tunnel having a locally varying slope α may be advantageous. A smaller slope α may for example be employed to offset a locally smaller viscosity η, and vice versa, so as to maintain an approximately constant substrate speed throughout the process tunnel.

In order to allow an atomic layer deposition apparatus 100 to be used in combination with substrates of different material densities ρ, and/or with gases having different viscosities η, it may be provided with a tilt adjuster 150 configured to enable changing of the slope α of at least a portion of the process tunnel. Changing substrates 130 for more dense ones, for example, may require the slope α of the process tunnel to be reduced in order to ensure that the denser substrates are still exposed sufficiently long to the reactive gases in the respective gas zones Likewise, changing precursors for ones having a higher viscosity η may require the slope α of the process tunnel to be increased. A tilt adjuster or tilt adjustment mechanism 150 may have any suitable form, and may typically include pivotal arrangement of the process tunnel to allow for easy manipulation of its slope.

In some embodiments of the disclosed atomic layer deposition apparatus 100, the above-discussed passive gravity drive may be supplemented by other, auxiliary drive and/or guide systems.

Figure 6:
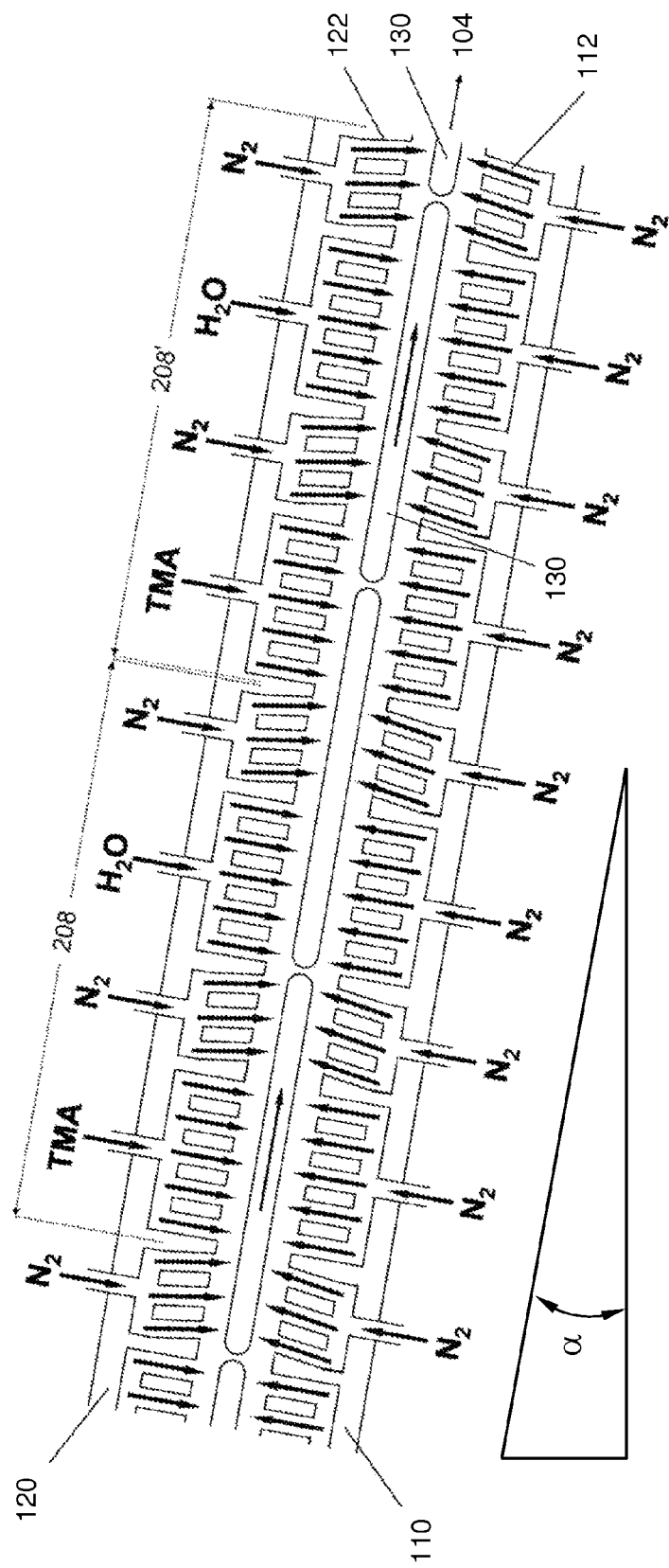
FIG. 6 is a diagrammatic longitudinal cross-sectional view of a portion of a process tunnel, wherein a number of gas injection channels inject gas into the tunnel space in a direction partly parallel to the transport direction, so as to aid in driving any substrates.

One such auxiliary drive system is illustrated in FIG. 6. In the schematically shown embodiment of the apparatus 100, the purge gas (nitrogen, $N_2$) injections channels have been slanted such that the tangential component of the gas flows helps to drive the substrates 130 in the transport direction 104. In another embodiment the purge gas injection channels may be oppositely oriented, such that the tangential component of the injected gas flows helps to slow down the substrates 130. Slanted gas injection channels as shown in FIG. 6 may be advantageous in entrance sections of a process tunnel, to aid in speeding up the substrates 130 to their equilibrium velocities, whereas oppositely oriented gas injection channels may be advantageous in exit sections to aid in slowing down the substrates. In any case, the magnitude of the gas flows may be used to control the speed of the substrates 130. Which gas injection channels 112, 122 to place at an angle may be subject to design considerations, but in principle any gas injection channel may do.

Another auxiliary drive system may include grooves in the tunnel walls 110, 120, the grooves being elongated in the longitudinal direction and having one end proximate a gas injection channel 112, 122 or a gas exhaust channel, as disclosed in U.S. Pat. No. 6,824,619 of applicant, which is incorporated herein by reference, where it is used to impart a rotational movement on a floating substrate. Similarly, this method can be used to impart linear movement to a substrate.

As the quality of a deposited film may depend on the surface temperature of the substrate during processing, substrates may be preheated before being subjected to the deposition process. Preheating of a substrate may be done by providing the deposition apparatus with a special pre-heat tunnel segment, located upstream of the first reactive tunnel segment, i.e. the first tunnel segment wherein a substrate is subjected to two or more precursors. In the pre-heat tunnel segment, a substrate may be brought into contact with no more than a purge gas, which is kept at the same or at a higher temperature than that of the reactive sections. Similarly, a cool-down segment may be provided at the end of the process tunnel, downstream of the last reactive tunnel segment. As the primary purpose of the purge gas in the pre-heat and cool-down segments is to transfer heat, helium—which has a relatively high thermal conductivity—is a good choice that helps to minimize the length of such a segment. In one embodiment of the atomic layer deposition apparatus, a pre-heat and/or cool-down segment may additionally serve to allow substrates to speed up or slow down. Such double function segments may for example be equipped with slanted gas injection channels as described with reference to FIG. 6, and/or a particular slope that matches their purpose (e.g. a relatively large downward slope for a pre-heat segment, and an upward slope for a cool-down segment).

Further, to facilitate the loading and discharging of substrates into/from the process tunnel by a mechanical substrate handler, an entrance and/or an exit segment of the tunnel—reactive or non-reactive—may be provided with a larger spacing H between the tunnel walls to increase the gap $d_g$ between the upper 130b and lower 130a surface of an inserted substrate 130 and the upper 120 and lower 110 tunnel wall, respectively. A larger gap $d_g$ between the tunnel walls 110, 120 and the substrate 130 comes at the penalty of an increased gas flow rate, since the force to be delivered by the lower gas bearing to carry the weight of the substrate does not change.

Figure 7:
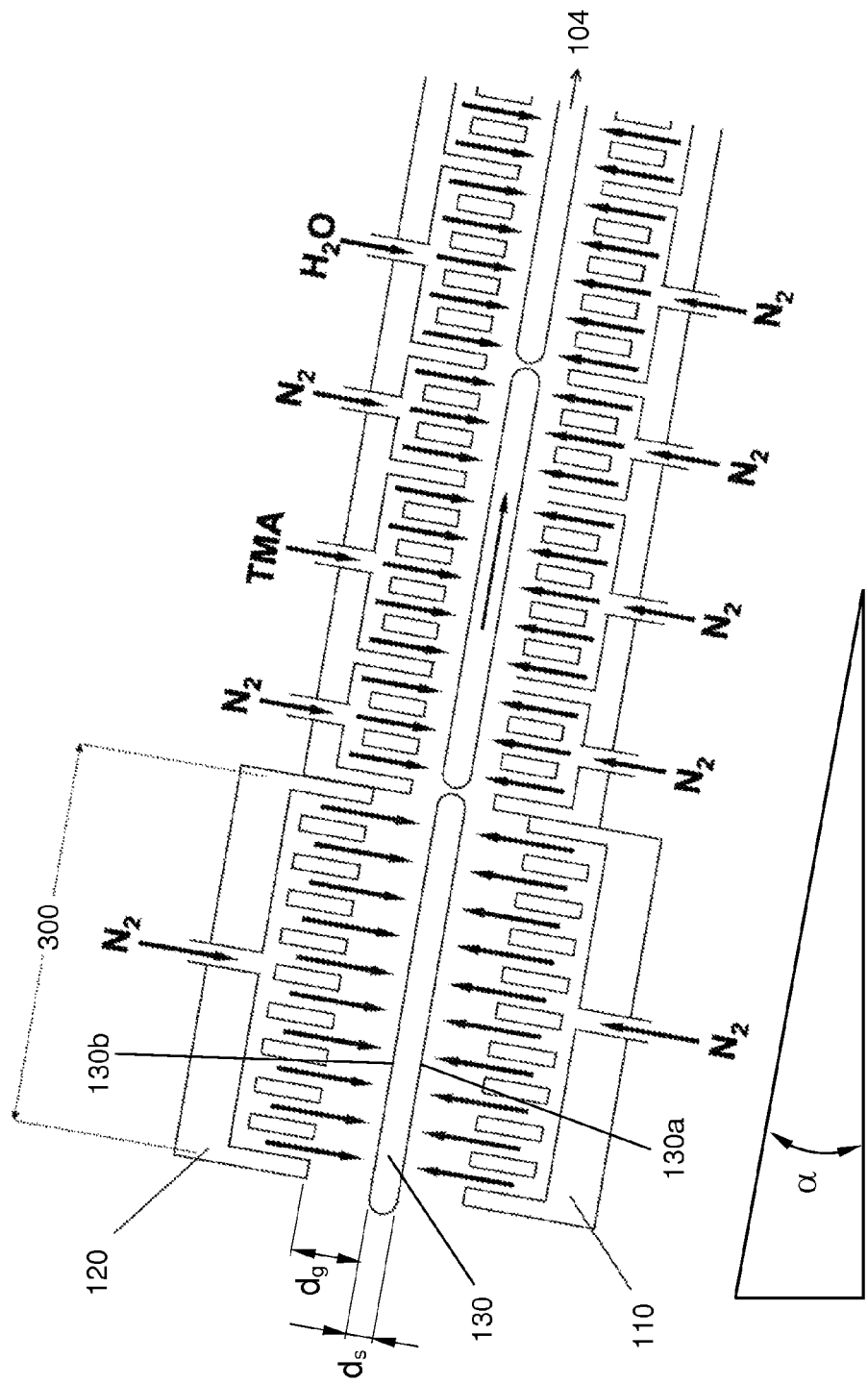
FIG. 7 is a diagrammatic longitudinal cross-sectional view of a portion of a process tunnel, provided with an entrance section with an enlarged gap between the tunnel walls.

FIG. 7 schematically illustrates a longitudinal cross-sectional view of an entrance section 300 of a process tunnel with an enlarged spacing H between the tunnel walls 110, 120. Since a typical spacing H may measure about ($d_s$+300 µm), it is worth noting that an 'enlarged spacing' may measure as little as, for example, ($d_s$+500 µm) (thus about 0.25 mm from each side 130a, 130b of the substrate to the respective tunnel wall 110, 120). The depicted entrance section 300 may also serve as a preheat segment. To this end, it may be injected with heated nitrogen ($N_2$), and made long enough to ensure that a substrate 130 is properly warmed up to the desired processing temperature. To achieve proper warming, the transport velocity $v_s$ of a substrate 130 and the width of the gap $d_g$ are parameters to be taken into account. After all, a higher transport velocity $v_s$ will reduce the length of stay of a substrate 130 in the preheat segment, whereas with a larger gap $d_g$ heating of a substrate will be more gradual. In case entrance section 300 does not itself serve as a pre-heat segment, a pre-heat section, not shown, with small gap $d_g$ may follow wherein only $N_2$ is introduced, to allow for adequate heating of the substrate before the atomic layer deposition process commences as discussed before. Assuming a wafer velocity of 0.25 m/s and a heat-up time of 4 s, a pre-heat length of about 1 m would be required. Alternatively, gases with a higher thermal conductivity such as He and $H_2$ can be used as a heating gas in the entrance or pre-heat section instead of $N_2$, although $N_2$ is preferred because of its relatively low cost.

Figure 9:
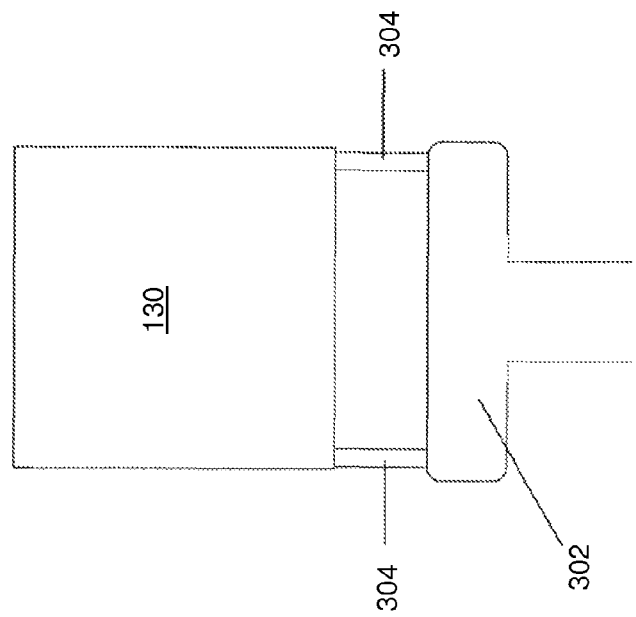
FIG. 9 is a diagrammatic top view of an exemplary embodiment of a mechanical substrate handler.
Figure 8:
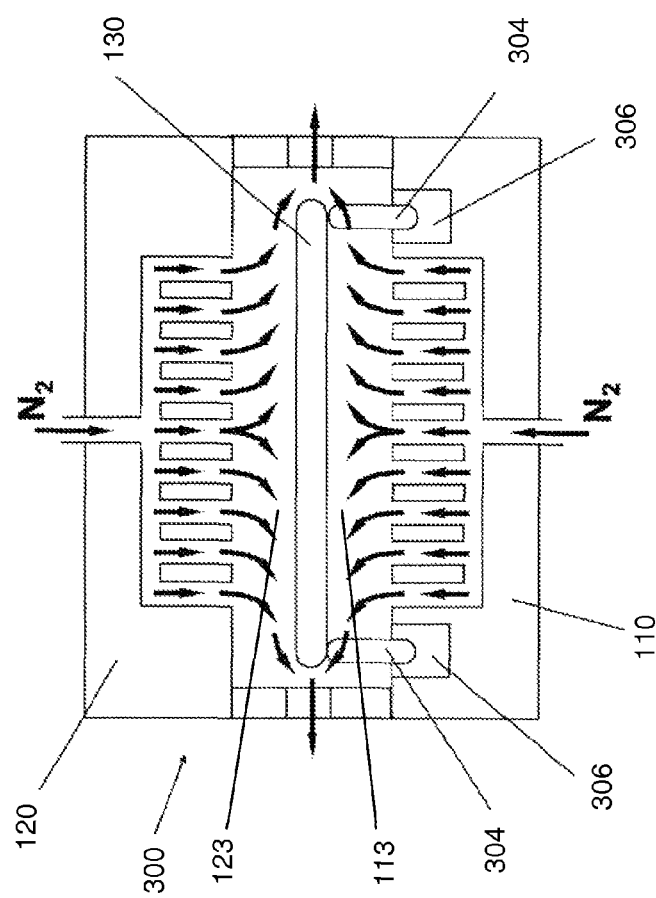
FIG. 8 is a diagrammatic lateral cross-sectional view of an entrance section of a process tunnel.

Entrance section 300 is shown schematically in a lateral cross-sectional view in FIG. 8. The figure aims to illustrate how a mechanical substrate handler 302 (shown in a top view in FIG. 9), having fork teeth 304 configured for supporting a substrate 130, inserts said substrate into the tunnel segment 300. When substrate 130 is inserted into entrance section 300 by substrate handler 302, the gas bearings inside the tunnel segment will take over the load. Wafer handler 302 may then lower its teeth 304, 304' a bit (further) into the elongate recesses 306, 306', and retract from the tunnel.

The substrate handler 302 may release a substrate 130 with zero initial velocity. Alternatively, the substrate handler 302 may impart some forward momentum to the substrate 130 as it releases the substrate 130. In a preferred embodiment, the substrate handler 302 is configured to feed substrates 130 at a speed smaller than an equilibrium speed that the substrates obtain when moving through the process tunnel, so as to reduce the chance of collisions between consecutively inserted substrates.

The dimensions and working parameters of the disclosed atomic layer deposition apparatus may vary, depending on the specific application it is built and used for. Here is an illustrative example in some numeric detail. Depositing a 10 nm film of aluminum oxide onto a standard circular 300 mm silicon wafer may involve two precursors, tri-methyl aluminum (Al(CH$_3$)$_3$, TMA) and water ($H_2O$). As an alternative for water, ozone ($O_3$) may be used. Nitrogen ($N_2$) may be used both as an inert carrier gas in the precursor zones and as purge gas in the purge gas zones. Each of the zones may have a length of several centimeters, typically 2-5 cm, in the transport direction. To accommodate a single train of wafers, each having a lateral dimension of 300 mm, the width of the process tunnel needs to measure a little over 300 mm. In case a precursor zone measures 5 cm in length, whereas a purge gas zone measures 2 cm, the length of a single tunnel segment amounts to 0.14 m. As a single tunnel segment is responsible for depositing one monolayer of aluminum oxide of about 0.1 nm thickness, a total of 100 segments is required to grow a 10 nm film. Consequently, the length of the process tunnel needed for deposition comes to approximately 14 meters. Wafers may be transported through the tunnel at a speed as high as 0.25 m/s, which, for this specific example, would lead to a throughput capacity of about 3000 wafers per hour. Using the following estimates: $\rho \approx 2300$ kgm$^{-3}$, $d_s \approx 200$ µm, g=9.81 ms$^{-2}$, $\eta=2.5 \cdot 10^{-5}$ kgm$^{-1}$s$^{-1}$, and abiding by equation (10), equation (4) yields a desired angle of inclination $\alpha$ of approximately 1.6°. In case the initial speed of the wafers is not equal to the desired equilibrium speed of 0.25 m/s, the process tunnel may have to be extended so as to provide for an entrance portion wherein the wafers can speed up or slow down to their desired equilibrium velocities. Substituting the above numbers into equation (6) results in $\tau$=0.92. Substituting this value into equation (7), together with $v_{s,eq}$=0.25 m/s, such an entrance portion would have to measure about 0.92 m in length in case the substrates have zero initial velocity.

Above, the invention has been described in terms of a first and a second precursor. One skilled in the art will recognize, however, that atomic layer deposition may be performed using more than two precursors. It is emphasized here, that the language of the claims does not intend to exclude an atomic layer deposition apparatus featuring three, four or more precursors. To that end, each segment may comprise three, four or more precursor gas injection zones all separated by purge gas injection zones. The segments of a process tunnel need not be identical. Nanolaminate films may for example be deposited when a number of successive segments of a first configuration for depositing a number of monolayers of a first film having a first composition, is alternated by a number of successive segments of a second configuration, for depositing a number of monolayers of a second film having a second composition. And such a sequence of segments can be repeated until the desired number of nanofilms is deposited. Also, although only aluminum oxide was mentioned specifically as an example of a material film to be deposited, it will be clear that the apparatus and method of the invention can be applied in combination with all precursor materials and film compositions that are now known in the art.

In addition, it is noted that the substrate may have a circular form, a square form, a rectangular form or triangular form or any other form that is available. Preferably, the form of the substrate is such that it allows a good filling of a surface area when the substrates are placed adjacent to each other, such as a square or rectangular form. Another general measure that may be taken to increase the throughput capacity of the ALD apparatus is to widen the process tunnel, so as to enable it to accommodate two or more parallel trains of substrates. Doubling the width of the tunnel, for example, potentially doubles the throughput of the apparatus.

Further, while illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Particular features, structures, or characteristics of one or more embodiments may be combined in any suitable manner to form new, not explicitly described embodiments.

LIST OF ELEMENTS

100 Atomic layer deposition apparatus
102 Process tunnel space
103 Process tunnel space region adjacent side wall
104 Transport direction
106 Side wall of process tunnel
108 Exhaust channel
110 First tunnel wall
112 Gas injection channels in first tunnel wall
113 Lower gas bearing
114 Gas source associated with gas injection channels in first tunnel wall
120 Second tunnel wall
122 Gas injection channels in second tunnel wall
123 Upper gas bearing
124 Gas source associated with gas injection channels in second tunnel wall
130 Substrate
130a,b Lower surface (a) or upper surface (b) of substrate
140 spacing adjuster
150 tilt adjuster
202 First precursor gas zone
204 Second precursor gas zone
206 Purge gas zone
208 Tunnel segment comprising four laterally extending gas zones
300 Entrance section of process tunnel
302 Mechanical substrate handler
304 Fork teeth
306 Elongate recess
Mathematical Symbols
$d_g$ Width of gap between substrate's surface and first/second tunnel wall
$d_s$ Substrate thickness
g Gravitational acceleration
H Height of process tunnel, i.e. spacing between first and second process tunnel walls
$v_{s,eq}$ Equilibrium velocity of substrate
$x_{eq}$ Run-up length for substrate to reach equilibrium velocity
α Angle of inclination of the process tunnel relative to horizontal
ρ Substrate density
η Viscosity of gas bearing

We claim:

1. An atomic layer deposition apparatus, comprising:
a first, lower wall;
a second, upper wall parallel to the first wall and spaced apart from the first wall;
two side walls connecting the first wall and the second wall;
wherein the first wall, the second wall and the two side walls bound a process tunnel configured to allow a substantially flat substrate, oriented parallel to said first and second walls, to be accommodated in the process tunnel leaving a first narrow gap between an upper side of the substrate and the second wall and a second narrow gap between a lower side of the substrate and the first wall, the process tunnel having a longitudinal direction which, in use, is a transport direction of the substrate in the process tunnel, and the process tunnel having a lateral direction that is substantially perpendicular to the longitudinal direction and parallel to the first wall and the second wall, a lower, innermost boundary of the process tunnel is defined by the first wall and an upper, innermost boundary of the process tunnel is defined by the second wall;
a plurality of gas injection channels, provided in both the first wall and the second wall of the process tunnel, wherein outflow openings of said plurality of gas injection channels are distributed over respective inner surfaces of the first and second walls in a spaced apart manner both along the transport direction and the lateral direction, whereby the outflow openings in the first, lower wall are configured to identically inject gas into the process tunnel to provide a first, lower gas bearing, while the outflow openings in the second, upper wall are configured to identically inject gas into the process tunnel to provide a second, upper gas bearing, said first and second gas bearings being configured to floatingly support and accommodate substrates;
a plurality of gas exits accommodated in both of the two side walls and configured to exhaust gas from tunnel space regions between both lateral edges of the substrate and the respective side walls, the plurality of gas exits being the only gas exits of the process tunnel and are dimensioned to restrict an outflow of gas from the process tunnel during use so as to cause pressure buildup and to stabilize a lateral position of the substrate;
wherein gas injection channels of the plurality of gas injection channels which are located in at least one of the first wall and the second wall, viewed in the transport direction, are connected successively to a first precursor gas source, a first purge gas source, a second precursor gas source and a second purge gas source, so as to create a tunnel segment that—in use—comprises, in succession along the transport direction, laterally extending zones including a first precursor gas, a first purge gas, a second precursor gas and a second purge gas, respectively, wherein two or more of such tunnel segments are disposed in succession in the transport direction;
wherein positions of the plurality of gas injection channels and positions of the plurality of gas exits are configured to provide that said gases in said zones flow substantially in the lateral direction towards the plurality of gas exits;
wherein a height of the first and second narrow gaps and an amount of the first and second purge gases that in use is supplied to the first and second narrow gaps are configured to provide that the lateral gas flows of the first and second purge gases have a relatively high velocity to create gas phase diffusion barriers that prevent the first and second precursor gases from mixing and that constitute the first and second purge gas zones; and
wherein, viewed in the transport direction, at least one portion of the process tunnel has a downward slope (α), so as to enable gravity driven transport of the substrate through said at least one portion of the process tunnel.

2. The atomic layer deposition apparatus according to claim 1, wherein different portions of the process tunnel have mutually different slopes.

3. The atomic layer deposition apparatus according to claim 1, wherein the downward slope is a substantially constant slope along the transport direction.

4. The atomic layer deposition apparatus according to claim 1, wherein said apparatus is configured such that—in use—a spacing between the first, lower wall and the second, upper wall H is within a range of H=1.4 $d_s$ to 5.0 $d_s$ wherein $d_s$ is a thickness of a substrate being processed in the tunnel.

5. The atomic layer deposition apparatus according to claim 1, wherein said apparatus is configured such that—in use—a spacing between the first, lower wall and the second, upper wall H is within a range of H=1.8 $d_s$ to 2.2 $d_s$ wherein $d_s$ is a thickness of a substrate being processed in the tunnel.

6. The atomic layer deposition apparatus according to claim 1, wherein said apparatus is configured such that—in use—a spacing between the first, lower wall and the second, upper wall H is in a range between ($d_s$+100 μm) and ($d_s$+2 mm), wherein $d_s$ is a thickness of a substrate being processed in the process tunnel.

7. The atomic layer deposition apparatus according to claim 1, wherein said apparatus is configured such that—in use—a spacing between the first, lower wall and the second, upper wall H is in a range between about ($d_s$+200 μm) and ($d_s$+400 μm).

8. The atomic layer deposition apparatus according to claim 1, further comprising a spacing adjuster configured to enable changing of a spacing (H) between the first, lower wall and the second, upper wall over said at least one portion of the process tunnel.

9. The atomic layer deposition apparatus according to claim 1, further comprising a tilt adjuster configured to enable changing of the slope (α) of said at least one portion of the process tunnel.

10. The atomic layer deposition apparatus according to claim 1, further comprising:
a substrate handler for feeding substrates to an entrance of the process tunnel, said substrate handler being configured to feed substrates at a speed less than an equilibrium speed ($v_{s,eq}$) with which the substrates move through said at least one portion of the process tunnel.

11. The atomic layer deposition apparatus according to claim 1, wherein at least one gas injection channel is configured to inject gas into the process tunnel in a direction having a non-zero component in the transport direction.

12. The atomic layer deposition apparatus according to claim 1, wherein the gas injection channels in the first, lower wall are connected to a source of inert gas.

13. The atomic layer deposition apparatus according to claim 1, wherein the first, lower and second, upper walls are symmetrical in that opposite gas injection channels are connected to gas sources of a substantially same gas composition.

14. The atomic layer deposition apparatus according to claim 1, comprising one or more tunnel segments of a first configuration including a first combination of precursor gases, and one or more tunnel segments of a second configuration including a second combination of precursor gases.

15. The atomic layer deposition apparatus according to claim 2, wherein:
said apparatus is configured such that—in use—a spacing between the first, lower wall and the second, upper wall H is within a range of H=1.4 $d_s$ to 5.0 $d_s$ wherein $d_s$ is a thickness of a substrate being processed in the tunnel;
said apparatus is configured such that—in use—a spacing between the first, lower wall and the second, upper wall H is within a range of H=1.8 $d_s$ to 2.2 $d_s$ wherein $d_s$ is a thickness of a substrate being processed in the tunnel;
said apparatus is configured such that—in use—a spacing between the first, lower wall and the second, upper wall H is in a range between ($d_s$+100 μm) and ($d_s$+2 mm);
said apparatus is configured such that—in use—a spacing between the first, lower wall and the second, upper wall H is in a range between about ($d_s$+200 μm) and ($d_s$+400 μm);
a spacing adjuster is provided, configured to enable changing of the spacing (H) between the first, lower wall and the second, upper wall over said at least one portion of the process tunnel;
a tilt adjuster is provided, configured to enable changing of the slope (α) of said at least one portion of the process tunnel;
a substrate handler is provided for feeding substrates to an entrance of the process tunnel, said substrate handler being configured to feed substrates at a speed smaller than an equilibrium speed ($v_{s,eq}$) with which the substrates move through said at least one portion of the process tunnel;
at least one gas injection channel is configured to inject gas into the process tunnel in a direction having a non-zero component in the transport direction;
the gas injection channels in the first, lower tunnel wall are connected to a source of inert gas; and
the first, lower and second, upper tunnel wall are symmetrical in that opposite gas injection channels are connected to gas sources of a substantially same gas composition.

16. The atomic layer deposition apparatus according to claim 3, wherein:
said apparatus is configured such that—in use—a spacing between the first, lower wall and the second, upper wall H is within a range of H=1.4 $d_s$ to 5.0 $d_s$ wherein $d_s$ is a thickness of a substrate being processed in the tunnel;
said apparatus is configured such that—in use—a spacing between the first, lower wall and the second, upper wall H is within a range of H=1.8 $d_s$ to 2.2 $d_s$, wherein $d_s$ is a thickness of a substrate being processed in the tunnel;
said apparatus is configured such that—in use—a spacing between the first, lower wall and the second, upper wall H is in a range between ($d_s$+100 μm) and ($d_s$+2 mm);
said apparatus is configured such that—in use—a spacing between the first, lower wall and the second, upper wall H is in a range between about ($d_s$+200 μm) and ($d_s$+400 μm);
a spacing adjuster is provided, configured to enable changing of the spacing (H) between the first, lower wall and the second, upper wall over said at least one portion of the process tunnel;
a tilt adjuster is provided, configured to enable changing of the slope (α) of said at least one portion of the process tunnel;
a substrate handler is provided for feeding substrates to an entrance of the process tunnel, said substrate handler being configured to feed substrates at a speed smaller than an equilibrium speed ($v_{s,eq}$) with which the substrates move through said at least one portion of the process tunnel;
at least one gas injection channel is configured to inject gas into the process tunnel in a direction having a non-zero component in the transport direction;
the gas injection channels in the first, lower tunnel wall are connected to a source of inert gas; and
the first, lower and second, upper tunnel wall are symmetrical in that opposite gas injection channels are connected to gas sources of a substantially same gas composition.

* * * * *